United States Patent [19]

Furuyama

[11] Patent Number: 5,317,540
[45] Date of Patent: May 31, 1994

[54] SEMICONDUCTOR MEMORY DEVICE

[75] Inventor: Tohru Furuyama, Tokyo, Japan

[73] Assignee: Kabushiki Kaisha Toshiba, Kawasaki, Japan

[21] Appl. No.: 850,318

[22] Filed: Mar. 12, 1992

[30] Foreign Application Priority Data

Mar. 14, 1991 [JP] Japan .................. 3-74830
Mar. 5, 1992 [JP] Japan .................. 4-48312

[51] Int. Cl.$^5$ ............................................ G11C 13/00
[52] U.S. Cl. ..................... 365/230.01; 365/189.01; 365/238; 365/221
[58] Field of Search ................ 365/189.01, 189.02, 365/189.03, 189.04, 230.01, 238, 221, 222

[56] References Cited

U.S. PATENT DOCUMENTS

| | | | |
|---|---|---|---|
| 3,763,480 | 10/1973 | Weimer | 365/238 |
| 4,070,590 | 1/1978 | Ieda et al. | 365/355 |
| 4,225,945 | 9/1980 | Kuo | 365/149 |
| 4,593,382 | 6/1986 | Fujishima et al. | 365/149 |
| 4,648,073 | 3/1987 | Kenney | 365/149 |
| 4,758,987 | 7/1988 | Sakui | 365/189 |
| 4,943,944 | 7/1990 | Sakui et al. | 365/189 |
| 4,980,863 | 12/1990 | Ogihara | 365/205 |
| 5,025,294 | 6/1991 | Ema | 357/23.6 |
| 5,051,954 | 9/1991 | Toda et al. | 365/189 |
| 5,079,746 | 1/1992 | Sato | 365/149 |
| 5,091,761 | 2/1992 | Hiraiwa et al. | 357/23.6 |
| 5,091,885 | 2/1992 | Ohsawa | 365/263 |
| 5,172,198 | 12/1992 | Aritome et al. | 365/185 |
| 5,184,326 | 2/1993 | Hoffmann et al. | 365/201 |

FOREIGN PATENT DOCUMENTS 0157051 10/1895 .
0273639 7/1986 European Pat. Off. .
0398244 11/1990 .

OTHER PUBLICATIONS

Katsutaka Kimura et al., "A Block-Oriented RAM with Half-Sized DRAM cell and Quasi-Folded Data-Line Architecture" IEEE 1991 ISSCC, Session 6, Paper Tam 612 pp. 106-107.

Arimoto et al., "A Circuit Design of Intelligent CDRAM with Automatic Write back Capability", 1990 Symposium on VLSI Circuits, Digest of Technical Papers, pp. 79-80.

Sha et al., "A 4Mb DRAM with Cross-point Trench Transistor Cell", 1986 ISSCC Digest of Technical Papers, pp. 268-269.

Ema et al., "3-Dimensional Stacked Capacitor Cell for 16M and 64M DRAMs", 1988 IEDM Technical Digest, pp. 592-595.

Watanabe et al., "Stacked Capacitor Cells for High-density Dynamics RAMs", 1988 IEDM Technical Digest, pp. 600-603.

Sunouchi et al., "A Surrounding Gate Transistor (SGT) Cell for 64/256 M Bit DRAMs", 1989 IEDM Technical Digest, pp. 23-26.

(List continued on next page.)

*Primary Examiner*—Terrell W. Fears
*Attorney, Agent, or Firm*—Banner, Birch, McKie & Beckett

[57] ABSTRACT

A semiconductor memory device comprises a memory cell array in which cascade-gate dynamic memory cells are arranged in a matrix and which contains word lines connected in common to the memory cells in the same row and bit lines connected in common to the memory cells in the same column, and serial access control means which serially accesses a plurality of memory cells in a given column of the memory cell array, reads a plurality of bits of information in time-sequence from one of the memory cells storing information, and then sequentially rewrites the bits of information into a different memory cell unused for storing valid data, in the same column where the memory cell exists.

53 Claims, 12 Drawing Sheets

OTHER PUBLICATIONS

Fujishima et al., "A Storage-Node-Boosted RAM with Word-Line Delay Compensation", IEEE Journal of Solid State Circuits, vol. SC-17, No. 5, pp. 872-875, Oct. 1982.

Ohta et al., "A Novel Memory Cell Architecture for High-Density DRAMs", 1989 Symposium of VLSI Circuits, Digest of Tech. Papers, pp. 101-102.

Ohta et al., "Quadruply Self-Aligned Stacked High-Capacitance RAM Using $Ta_2O_5$ High Density VLSI Dynamic Memory", IEEE Transactions on Electron Devices, vol. ED-29, No. 3, Mar. 1982, pp. 368-376.

Ohta et al., "A Novel Memory Cell Architecture for High Density DRAMs", Sharp Technical Journal, vol. 44, Mar. 1990, Japan, pp. 47-50-See Figure 1 and 3.

Asakura et al., "Cell-Plate Line Connecting Complementary Bitline (C3) Architecture for Battery Operating DRAMs", 1991 Symposium on VLSI Circuits, May 30, 1991, pp. 59-60.

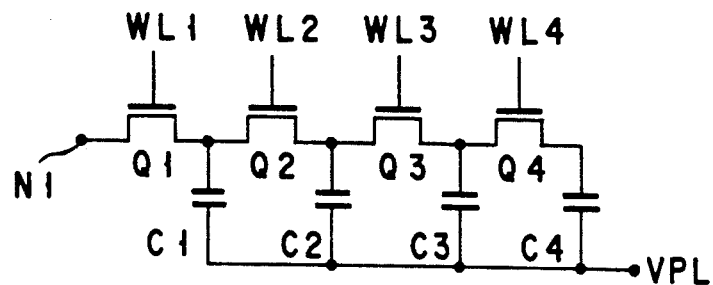
F I G. 1
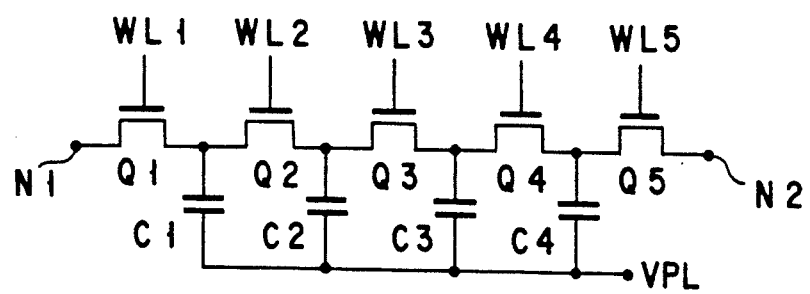
F I G. 2

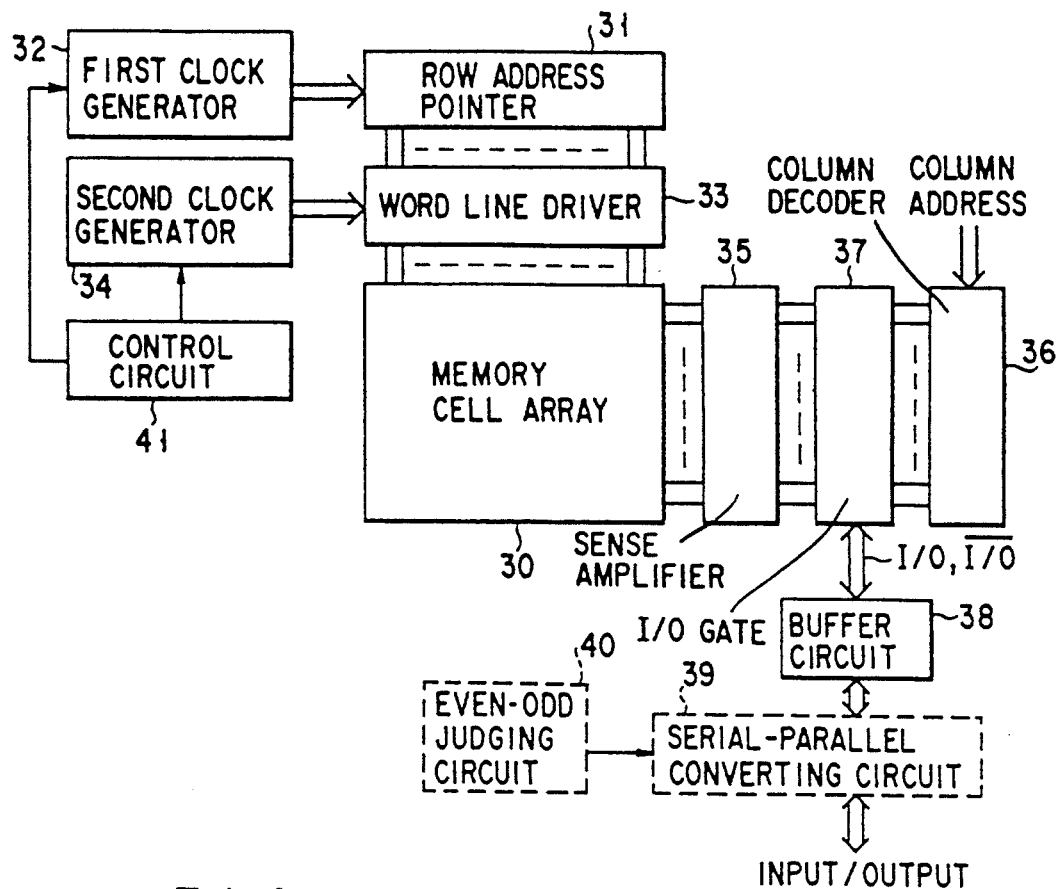
F I G. 3
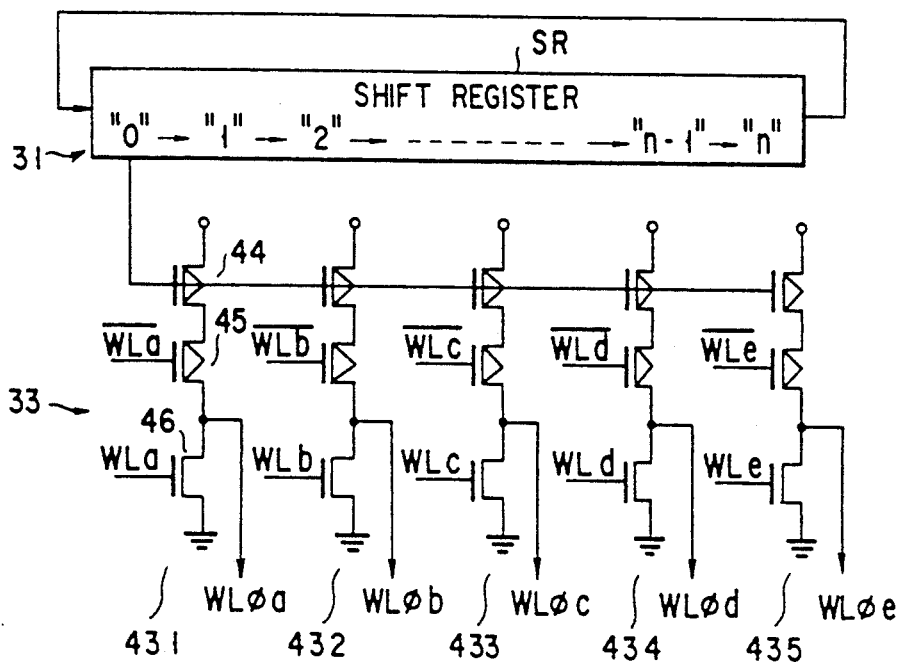
F I G. 5

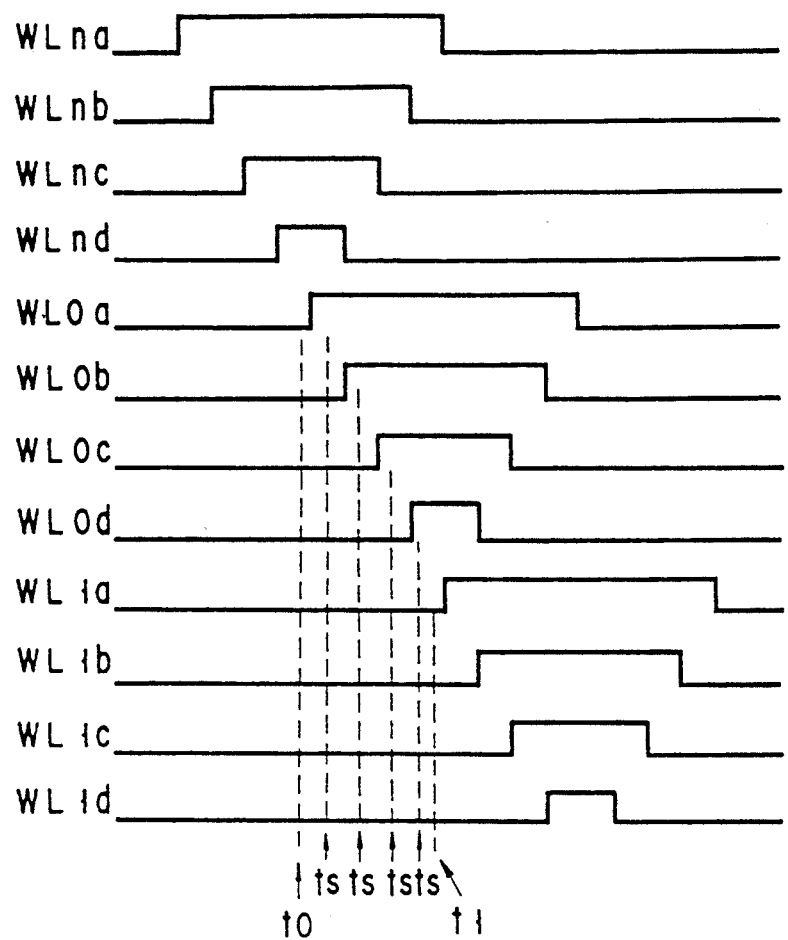
F I G. 15
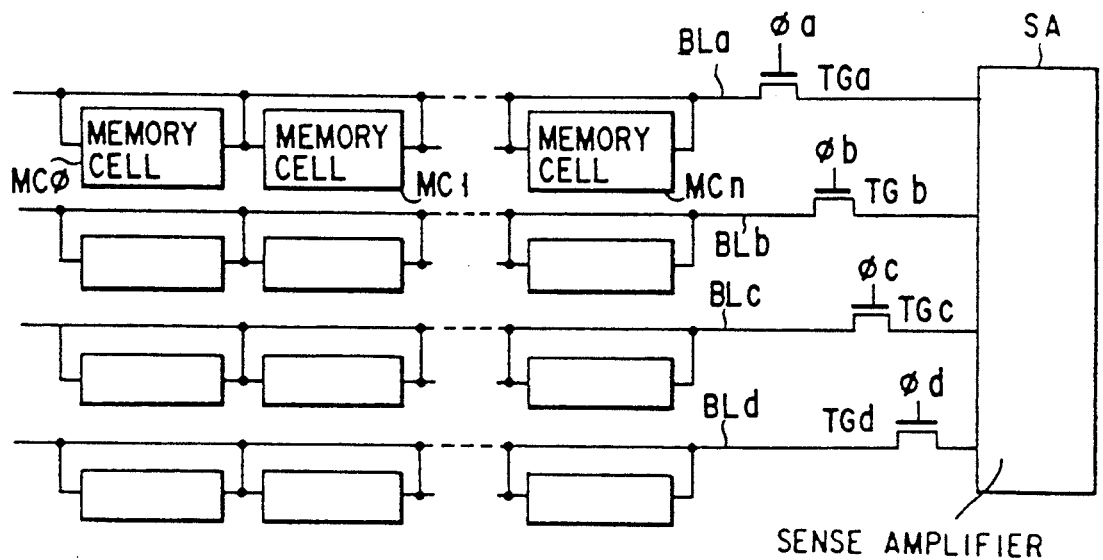
F I G. 16

SEMICONDUCTOR MEMORY DEVICE

BACKGROUND OF THE INVENTION

1. Field of the Invention

This invention relates to a semiconductor memory device, and more particularly to a dynamic random access memory (DRAM) with an array of cascade dynamic memory cells capable of storing bits of information in bits.

2. Description of the Related Art

DRAM cells now in practical use are made up of a transfer gate MOS (Metal-Oxide-Semiconductor) transistor connected to a word line and a bit line and an information-storing capacitor connected to this transistor.

In connection with this, the applicant of this invention has proposed cascade gate semiconductor memory cells, for example, as shown in FIGS. 1 and 2, in U.S. Pat. application Ser. No. 687,687.

The DRAM cell of FIG. 1 contains cascade-connected MOS transistors Q1 to Q4 and information-storing capacitors C1 to C4 one end of which is connected to one end of each of transistors Q1 to Q4. By performing on/off control of transistors Q1 to Q4 in a specified sequence, stored information is sequentially read to the node N1 from capacitors C1 to C4, starting with capacitor C1 nearest one end of the cascade connection (read/write node N1). It is also possible to sequentially write information at node N1 into capacitors C4 to C1, beginning with C4 farthest away from node N1.

The DRAM cell of FIG. 2 is such that an additional MOS transistor Q5 is connected between one end of DRAM cell transistor Q4 of FIG. 1 and a second node N2. By performing on/off control of transistors Q1 to Q5 in a specified sequence, stored information is sequentially read to the node N1 from capacitors C1 to C4, starting with capacitor C1 nearest the node N1. It is also possible to sequentially write information at node N2 into capacitors C1 to C4, beginning with C1 nearest node N1.

Cascade-gate memory cells as shown in FIGS. 1 and 2 can store bits of information in bits. An array using these cells requires only one connection between a memory cell and a bit line for every specified number of bits, which results in much higher packing density than that of a conventional DRAM with an array of one-transistor one-capacitor cells, thereby reducing the price per bit remarkably.

With a DRAM with the aforementioned cascade-gate memory cells, because the information stored in the cell is lost as a result of destructive reading, it is always necessary to rewrite the original information in it. Since the reading and writing order for the capacitors in one memory cell is determined, it is impossible to rewrite the information into a given capacitor immediately after it has been read from that capacitor. That is, rewriting into a given capacitor from which the information has been read is impossible until the succeeding capacitors within the same cell have been read from.

For this reason, when a DRAM is constructed using an array of aforementioned cascade-gate memory cells, a means is necessary which can sequentially rewrite (or write) the information after multiple bits have been read from the memory cells in time sequence.

In this connection, the applicant of this invention has proposed, in U.S. Pat. application Ser. No. 721,255, a semiconductor memory device that contains a storing means for temporarily storing bits of information read in time sequence from the memory cells and is able to sequentially rewrite (or write) the bits of information after the reading has finished.

It may be possible to construct a DRAM where a group of memory cells in a column of an array of cascade memory cells is accessed serially, making use of the ability of the above-mentioned cascade memory cells to be accessed serially. This construction, however, requires improvements in the method of rewriting the information read in time sequence from the cascade memory cells.

SUMMARY OF THE INVENTION

Accordingly, the object of the present invention is to provide a semiconductor memory device with a system for serially accessing memory cells in any given column within an array of cascade memory cells, which eliminates a register for temporarily storing the information read in time sequence from the memory cells for the rewrite operation in a serial access, thereby achieving higher packing density.

To achieve the foregoing object, the present invention comprises a memory cell array of cascade memory cells capable of storing a plurality of bits of information in bits, and serial access control means which serially accesses a plurality of memory cells in a given column of the memory cell array, reads a plurality of bits of information in time-sequence from one of the memory cells storing information, and then sequentially rewrites the bits of information into an unused memory cell in the same column where the memory cell exists.

This semiconductor memory device has an extra memory cell per column in addition to the memory cells for storing data. In a serial access to a plurality of memory cells in any given column, it is possible to serially access memory cells by column by reading the information from a cell and then storing (rewriting) it into a presently vacant cell as a result of the preceding access. This eliminates a means for temporarily storing the information read in time sequence from the memory cells storing data for a rewrite operation, making the packing density higher and the chip size much smaller.

Therefore, it is possible to make external memory devices operate faster by substituting a semiconductor memory device of the present invention for a memory device for serially reading and writing data in blocks (such as magnetic disk drives used as external memory devices for computer systems).

Considering today's applications of DRAMs, since the field to which serial access techniques can be applied, such as block transfer with a cache memory or the processing and storage of image data, is expanding very rapidly, semiconductor memory devices of this invention will find very wide application.

Additional objects and advantages of the invention will be set forth in the description which follows, and in part will be obvious from the description, or may be learned by practice of the invention. The objects and advantages of the invention may be realized and obtained by mean of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an equivalent circuit diagram for a cascade-gate memory cell that has been proposed;

FIG. 2 is an equivalent circuit diagram for another cascade-gate memory cell that has been proposed;

FIG. 3 is a circuit diagram for a DRAM according to a first embodiment of the present invention;

FIG. 5 is a circuit diagram for portions of the address circuit and word-line driving circuit of FIG. 3;

FIG. 15 is a timing waveform diagram for explaining the operation of the DRAM of FIG. 13; and FIG. 16 is a circuit diagram for a portion of a DRAM according to a third embodiment of the present invention.

DETAILED DESCRIPTION OF THE PREFERRED EMBODIMENTS

Figure 4:
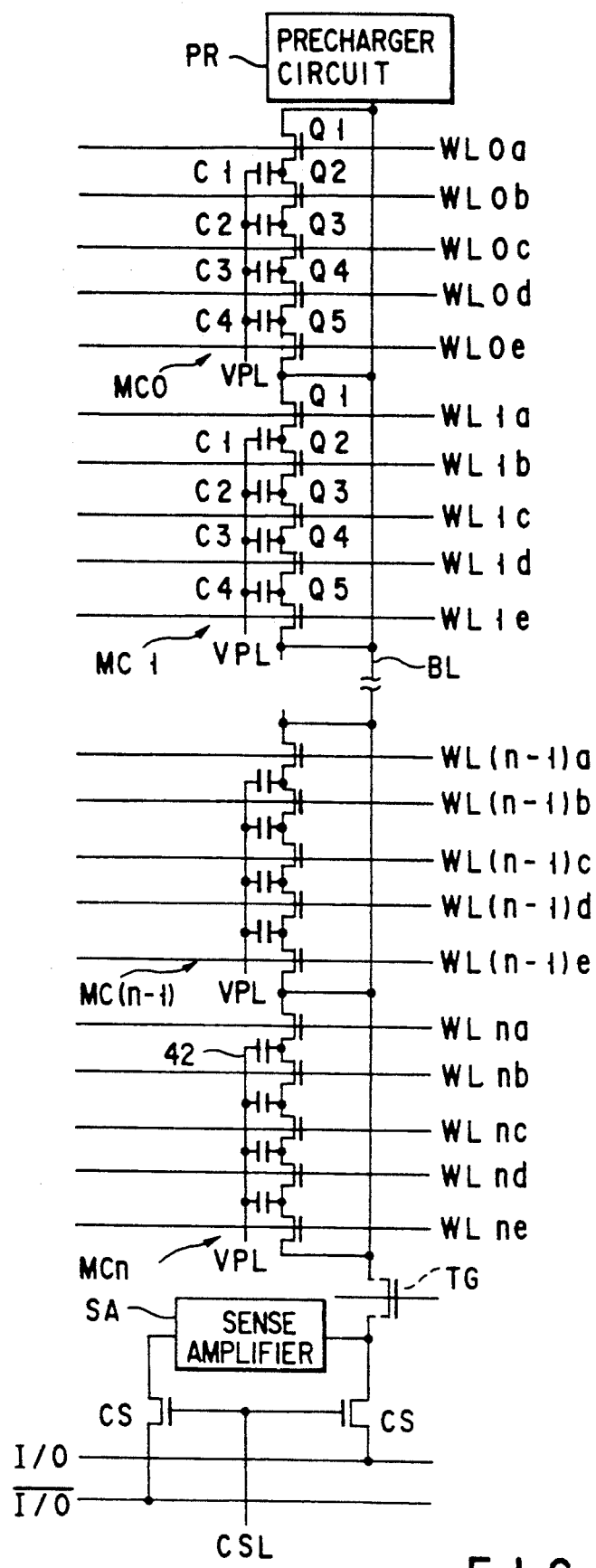
FIG. 4 is a circuit diagram for one column of the memory cell array of FIG. 3, including a sense amplifier and an input/output gate.

Referring to the accompanying drawings, embodiments of the present invention will be explained. The same parts are indicated by the same reference characters throughout the several views of the drawings, with a view to avoiding repeated explanations.

FIG. 3 is a circuit diagram for a portion of a DRAM according to a first embodiment of the present invention.

In FIG. 3, numeral 30 indicates a memory cell array where cascade-gate memory cells are arranged in a matrix so as to store a plurality of bits of information in bits; 31 a row address circuit (row address pointer) for supplying a row address signal to serially specify the row addresses in the memory cell array 30; 32 a first clock generating circuit for supplying a first clock signal to the row address circuit 31; 33 a word-line driving circuit for selectively driving the word lines connected to the memory cell with the address specified by the address circuit 31; and 34 a second clock generating circuit for supplying a second clock signal to the word-line driving circuit 33.

Numeral 35 represents a bit-line sense amplifier (hereinafter, referred to as a sense amplifier) for sensing the potential of the bit lines of the memory cell array 30; 36 a column decoder for decoding column addresses; 37 an input/output gate (a column select circuit) selectively driven by the output of the column decoder 36; and 38 a buffer circuit connected to the input/output gate 37 via an input/output line pair I/O and /(I/O).

A control circuit 41 controls the operation timing for various circuits including the first clock generating circuit 32, second clock generating circuit 34, and sense amplifier 35.

A combination of the control circuit 41, first clock generating circuit 32, second clock generating circuit 34, sense amplifier 35, row address circuit 31 and word-line driving circuit 33, provides the serial access control function that serially accesses the memory cells in any given column of the memory cell array 30, reads bits of information in time sequence from one memory cell of the memory cells storing information, and then sequentially rewrites these bits of information into a different memory cell not in use in the same column.

FIG. 4 is a circuit diagram of one column of the memory cell array 30, and the associated sense amplifier 35 and input/output gate 37.

MC0 to MCn indicate n (integer)+1 memory cells. Of these n+1 memory cells, n cells are used to store 4n bits of block data and the remaining one cell is an extra cell. BL represents a bit line connected to the memory cells MC0 to MCn in the same column, $V_{BL}$ a bit-line precharging power supply, PR a bit-line precharger circuit that is turned on by a bit-line precharging signal $\phi_{BL}$ with a specified timing.

SA indicates a latch amplifier, for example, provided for each column one of whose input/output node pair is connected to the bit line BL. Transfer gates CS for the input/output gate are connected between the input/output node pair of the sense amplifier SA and the input/output line pair I/O, /(I/O), and are controlled by column select lines CSL (column decoder output lines).

The memory cells MC0 to MCn are each made up of a cascade gate containing three or more MOS transistors (five in this case) Q1 to Q5 cascade-connected between the first node N1 and second node N2, and information-storing capacitors C1 to C4 connected at one end to the corresponding connection nodes between the cascade-connected MOS transistors, respectively, as shown in FIG. 2. The first node N1 and second node N2 are connected to each other and to the bit line BL. The gates of the transistors Q1 to Q5 of the memory cells MC0 to MCn are connected to the word lines (WL0a to WL0e) to (WLna to WLne), respectively. These word lines (WL0a to WL0e) to (WLna to WLne) are connected in common to the gates of the corresponding transistors Q1 to Q5 in a group of memory cells in the same row of the memory cell array 30. The other ends of the capacitors C1 to C4 are connected in common to a capacitor wire 42. In this embodiment, the plate electrodes of the capacitors C1 to C4 are connected to each other. The plate electrode thus connected is applied with a specified capacitor plate potential $V_{PL}$, which is also applied to the other memory cells.

FIG. 5 is a circuit diagram of portions of the row address circuit 31 and word-line driving circuit 33 of FIG. 3.

Figure 6:
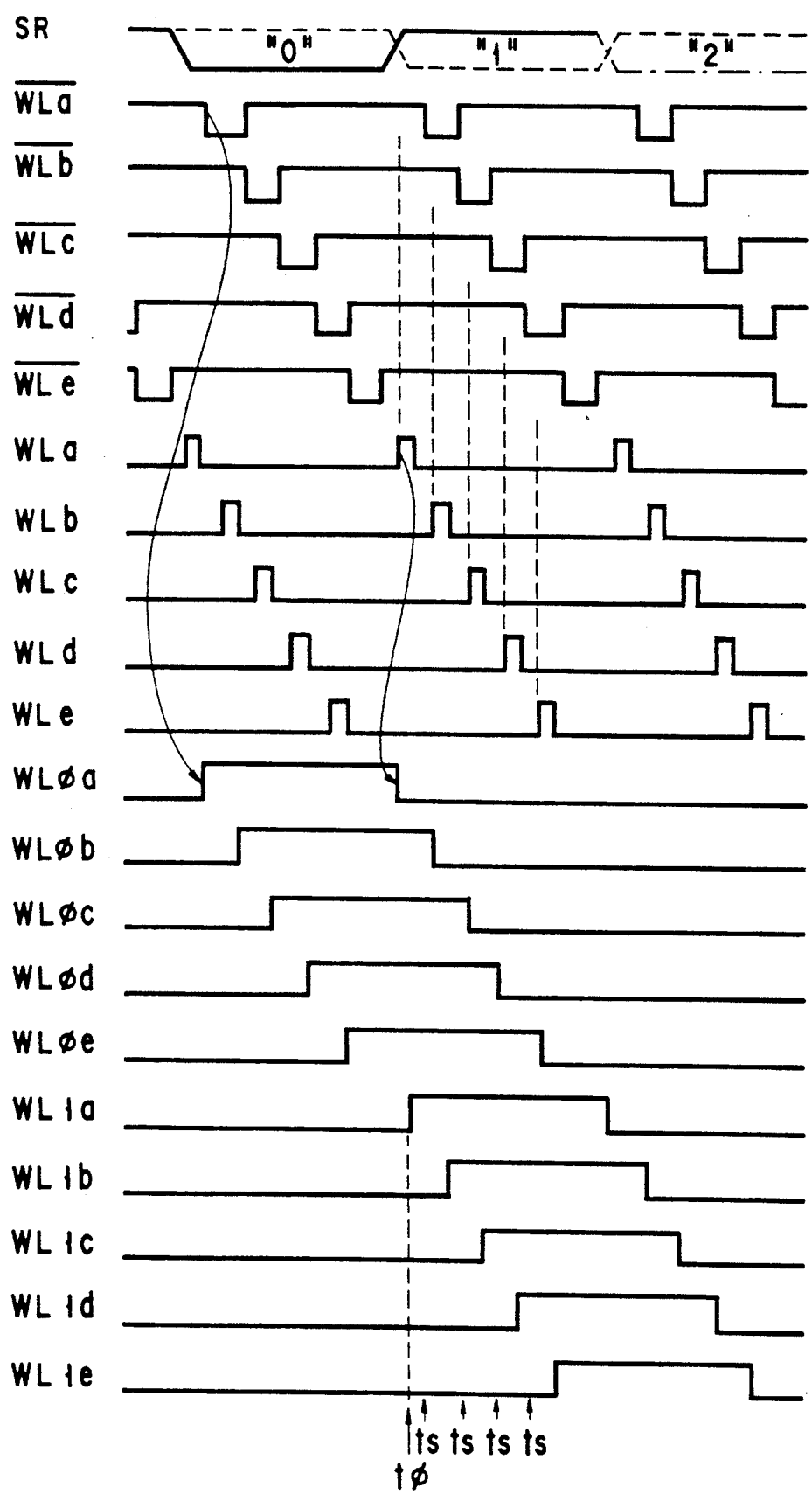
FIG. 6 is a timing waveform diagram for explaining the operation of the address circuit and word-line driving circuit of FIG. 5.

FIG. 6 is a timing waveform diagram for explaining the operation of the row address circuit 31 and word-line driving circuit 33 of FIG. 5.

In FIG. 5, the row address circuit 31 uses a shift register SR. This register SR has n+1 stages to deal with n+1 groups of word lines (WL0a to WL0e) to (WLna to WLne) in the memory cell array 30, one group consisting of five word lines. That is, the register SR has the number of stages equal to 1/k the number of rows (n+1)×k (an integer: 5 in this case) in the memory cell array 30. It is constructed in such a manner that the (n+1) stage shift circuits are serially connected to each other to form a ring circuit with the final-stage output going to the first stage as an input. The shift register SR is controlled at the start of an initial serial access operation after power has been supplied to the DRAM so that the shift register stage to specify the starting address (for example, the final stage) may first supply the address signal.

The word-line driving circuit 33 uses as many word-line driving circuits as the number of rows in the memory cell array 30, that is, n+1 groups of word-line driving circuits, one group consisting of five word-line driving circuits. The outputs of the individual stages of the shift register SR are supplied as operation control signals to the five word-line driving circuits 431 to 435 of a corresponding group. That is, the outputs of the individual stages of the shift register SR selectively control the five word-line driving circuits 431 to 435 of the corresponding group.

The word-line driving circuits 431 to 435 each have an operation controlling PMOS transistor 44, a word-line driving PMOS transistor 45, and a word-line pull-down NMOS transistor 46 cascade-connected between the word-line driving power supply potential node and the ground potential ($V_{SS}$) node. The gate of each transistor 44 is supplied in common with the output of a corresponding shift register stage. The gate of each transistor 45 is sequentially supplied with the pull-up control signal /WLa to /WLe from the second clock generating circuit 34, respectively. The gate of each NMOS transistor 46 is sequentially supplied with the pull-down control signal WLa to WLe from the second clock generating circuit 34, respectively. With this configuration, the word-line driving signal is supplied at each output node (the connection between the transistors 45 and 46) of the word line driving circuits 431 to 435, making it possible to control the five word lines (WLia to WLie: i=0, 1, ..., n) of each group in a manner that turns on these lines in sequence for a specified period of time in a serial access as will be described later.

Figure 7:
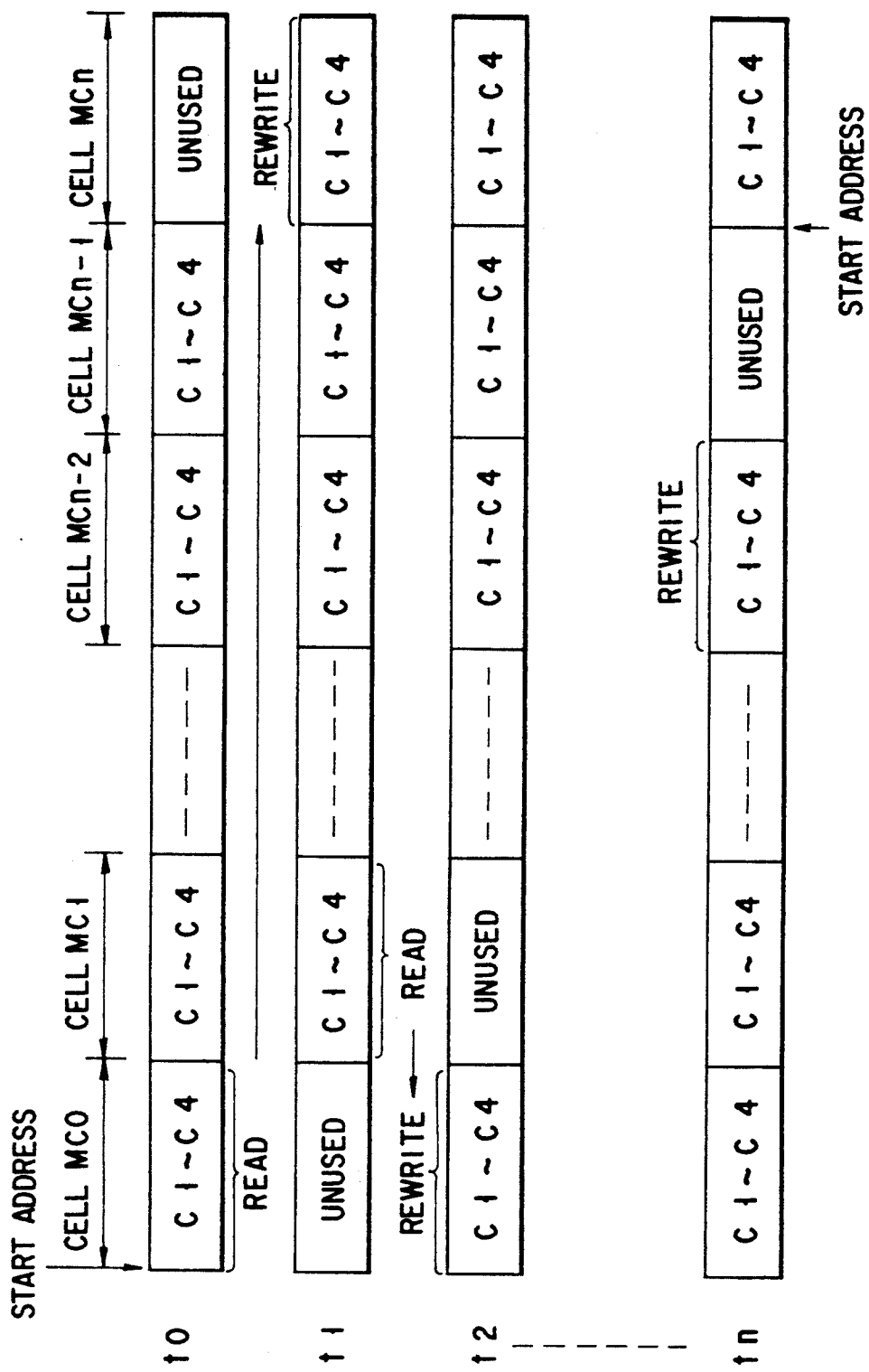
FIG. 7 is a timing diagram for explaining the operation of serially accessing the memory cells in any given column within the DRAM of FIG. 3.

FIG. 7 is a timing diagram for explaining the operation of serially accessing the memory cells in any given column of the DRAM of FIG. 3.

In the FIG. 3 DRAM, it is assumed that in the initial state, the cells MC0 to MC(n-1) store a series of data items (block data) with cell MCn not in use (storing no data). The serial access of sequentially reading out the block data and at the same time, rewriting it will be outlined, referring to FIG. 7.

In a first serial access, at time t0, the word lines WL0a to WL0e are sequentially turned on to read the stored 4 bits of information in sequence on the bit line BL from the capacitors C1 to C4 of cell MC0. Then, the word lines WL1a to WL1e are sequentially turned off to rewrite the 4-bit information into the capacitors C1 to C4 of an unused cell (MCn at this time) in the same column where the cell MC0 exists.

Similarly, at time t1, the 4-bit information is sequentially read from the cell MC1 onto the bit line BL, and then is rewritten into an unused cell (MC0 at this time) in the same column.

At each subsequent time, similar read/rewrite operations are done sequentially in units of two cells in the same column with their combination differing between the read and rewrite operations. Finally, at time tn, the 4-bit information in cell MC(n-1) is rewritten into cell MC (n-2).

By such a serial access, the block data has been stored in cells MCn, MC0 to MC(n-2).

Through the first serial access to n+1 cells in the same column, continuous block data stored in n memory cells have been sequentially read out, and at the same time, has been rewritten into n memory cells including one that had not been in use before this reading.

In a second serial access, the start address (word-line address) for the preceding serial access is reduced by one cell to begin by rewriting the read-out data from cell MCn into cell MC(n-1) and to end by rewriting the read-out data from cell MC(n-2) into cell MC(n-3). By this serial access, the block data has been stored into cells MC(n-1), MCn, MC0 to MC(n-3).

The operation of reducing the start address (word-line address) for the preceding serial access by one cell is easily performed by the shift resister SR made up of (n+1) stage shift circuits. Specifically, the state of the shift register SR at the end of the preceding serial access is retained, and after the preceding serial access has been completed or before the present serial access starts, the shift register SR is shifted by one stage during a dummy cycle, which should be provided.

The operation between time t0 and time t1 will be described, referring to FIG. 8.

Figure 8:
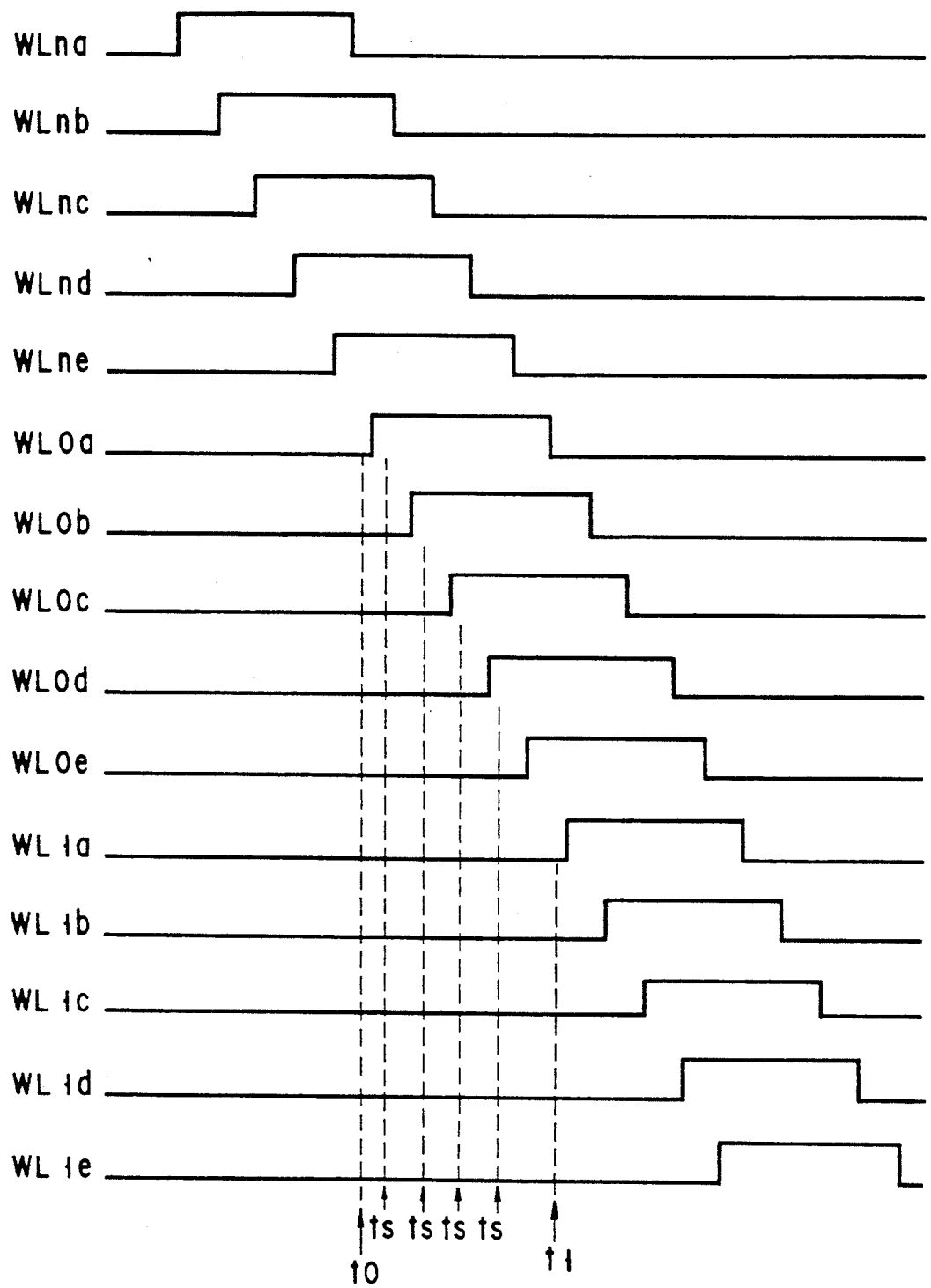
FIG. 8 is a timing diagram for explaining the operation of the DRAM of FIG. 3.

FIG. 8 is a timing waveform diagram for explaining the operation of the DRAM of FIG. 3.

The word lines (WLna to WLne) are controlled so as to turn off the transistors Q1 to Q5 of cell MCn in that order. With a specified timing with respect to control of these word lines, the word lines (WL0a to WL0e) are controlled so as to turn on the transistors Q1 to Q5 of cell MC0 in that order. When the transistor Q1 of cell MCn is off, the transistors Q2 to Q5 are on, and the transistors Q1 to Q5 of the other cells MC0 to MC(n-1) are off (at time t0), the bit-line precharging circuit PR precharges the bit line BL to a specified potential for a certain period of time. In this state, turning on the transistor Q1 of cell MC0 allows the stored information in the capacitor C1 of cell MC0 to be read out on the bit line BL via the transistor Q1. With the timing of ts, the sense amplifier SA operates to supply the read-out information. After the rewrite potential has been set on the bit line BL by this sense output, when the transistor Q2 of cell MCn is turned off, the potential of the bit line BL (the stored information in the capacitor C1 of cell MC0) is stored in the capacitor C1 of cell MCn. Then, after the bit line BL has been precharged again, when the transistor Q2 of cell MC0 is turned on, the stored information in the capacitor C2 of cell MC0 is read out on the bit line BL via the transistors Q2 and Q1. With the timing of ts, this read-out information is sensed by the sense amplifier SA, which in turn supplies it. After the rewrite potential has been set on the bit line BL by this sense output, when the transistor Q3 of cell MCn is turned off, the potential of the bit line BL (the stored information in the capacitor C2 of cell MC0) is stored in the capacitor C2 of cell MCn. Then, after the bit line BL has been precharged again, when the transistor Q3 of cell MC0 is turned on, the stored information in the capacitor C3 of cell MC0 is read out on the bit line BL via the transistors Q3 to Q1. With the timing of ts, this read-out information is sensed by the sense amplifier SA, which in turn supplies it. After the rewrite potential has been set on the bit line BL by this sense output, when the transistor Q4 of cell MCn is turned off, the potential of the bit line BL (the stored information in the capacitor C3 of cell MC0) is stored in the capacitor C3 of cell MCn. Then, after the bit line BL has been precharged again, when the transistor Q4 of cell MC0 is turned on, the stored information in the capacitor C4 of cell MC0 is read out on the bit line BL via the transistors Q4 to Q1. With the timing of ts, this read-out information is sensed by the sense amplifier SA, which in turn supplies it. After the rewrite potential has been set on the bit line BL by this sense output, when the transistor Q5 of cell MCn is turned off, the potential of the bit line BL (the stored information in the capacitor C4 of cell MC0) is stored in the capacitor C4 of cell MCn. After this, the transistor Q5 of cell MC0 is turned on, and then the transistor Q1 is turned off (the operating sequence may be reversed as long as it has been done by time t1 when the operation starts to read out the stored information from the next cell MC1 and rewrite it into the cell MC0). As a result of this, the transistor Q1 of cell MC0 is off, the transistors Q2 to Q5 are on, and the transistors Q1 to Q5 of the other cells MC1 to MCn are off, waiting for the reading of data from the next cell MC1 and the rewriting of the data into cell MC0.

In this state, by performing on/off control of the word lines (WL0a to WL0e) and (WL1a to WL1e) so that the transistors Q2 to Q5 of cell MC0 may be turned off in that order and, with a specified timing with respect to control of these transistors, the transistors Q1 to Q5 of cell MC1 be turned on in that order, it is possible to read the stored information from cell MC1 and rewrite it into cell MC0 in the same manner as reading from cell MC0 and rewriting into cell MCn.

With the DRAM of FIG. 3, turning on the transistors Q1 to Q5, in that order, of the cell to be read from allows the stored information in the capacitors C1 to C4 to be read on the bit line BL in sequence. Then, by activating a column select line CSL for a column to be selected at the time when a corresponding sense amplifier SA starts to operate, in order to turn on the transfer gate CS, it is possible to read the information outside the DRAM chip. That is, 4 bits of digital information can be read in a determined sequence. Because such a read operation is sequentially carried out on n memory cells (for example, n=128) in the column used for storing information, it is possible to read 4 bits×128=512 bits (or 64 bytes) in sequence from one column.

With the DRAM of FIG. 3, because the information read from a cell in time sequence is rewritten into another cell in the same column, a storing means is unnecessary which temporarily stores this information for a rewrite operation. This arrangement achieves higher packing density, making the chip size very small.

With the DRAM of FIG. 3, because the information read from a cell in time sequence is rewritten immediately after the reading, each bit requires the sense amplifier to operate only once for read/write operations, resulting in low power consumption.

For a write operation in the DRAM of FIG. 3, with the timing of ts, necessary data should be placed on the bit line BL for the rewrite operation. Selectively connecting each column to the data input/output circuit by the input/output lines I/O and /(I/O) allows the writing of input data or the transfer of read-out data to the output section. The input/output lines I/O and /(I/O) may be separated into input lines and output lines.

A refresh operation in the DRAM of FIG. 3 may be achieved by performing the above-mentioned serial access with the transfer gate CS in the off state. In this case, in response to an external refreshing signal, or to the output from a built-in refresh timer circuit, refresh operations may be carried out at regular intervals.

As shown by broken lines in FIG. 4, a transfer gate TG may be inserted between the bit line BL and the input/output node of the sense amplifier SA. To read information from the memory cell MCi, the transfer gate TG is brought into the off state after the signal from the memory cell MCi has reached the sense amplifier SA via the bit line BL, and then, the sense amplifier SA is activated. This prevents the sense amplifier SA from charging and discharging the large parasitic capacity on the bit line BL, thus making it possible to achieve both higher speed operations and lower power consumption at the same time. Specifically, by selectively performing on/off control of the transfer gate TG so that the sense amplifier SA may charge and discharge the bit line BL only at the time of rewriting (or writing), it is possible to reduce power consumption when read-out data is different from data to be written into.

Instead of the latch sense amplifier SA, a differential amplifier (not shown), which compares the bit line potential with the reference potential, may be used so that based on its sense output, a write circuit (not shown) can set a rewrite potential on the bit line BL.

As another example of memory cells MCi, cascade-gate memory cells as proposed in U.S. Pat. application Ser. No. 687,687 may be used. As still another example of memory cells MCi, the following approach may be used as disclosed by the applicant of this invention, et al. in Japanese Patent Application No. 3-41321: by setting the capacities of capacitors C1 to C4 so that their values may increase in the order of, for example, reading information, it is possible to prevent variations in the voltage on the bit line BL from decreasing gradually as the stored information is sequentially read from each capacitor, or to alleviate those voltage attenuations. This approach makes each variation in the voltage almost equal, thereby preventing the misreading of information. In the DRAM of FIG. 3, there are some restrictions on the random access capabilities and access time. However, by designing a DRAM of×4-bit construction with a serial-parallel converting circuit 39 between the I/O gate 37 and the input/output terminal (not shown) for serial-parallel conversion of read-out 4-bit data, it is possible to realize a perfect random access operation.

When the memory cell array is divided into subarrays and only some of them (for example, two or four) are activated simultaneously for power saving, serial-parallel conversion allows a DRAM of×8-bit construction or 16-bit construction.

Figures 9, 10:
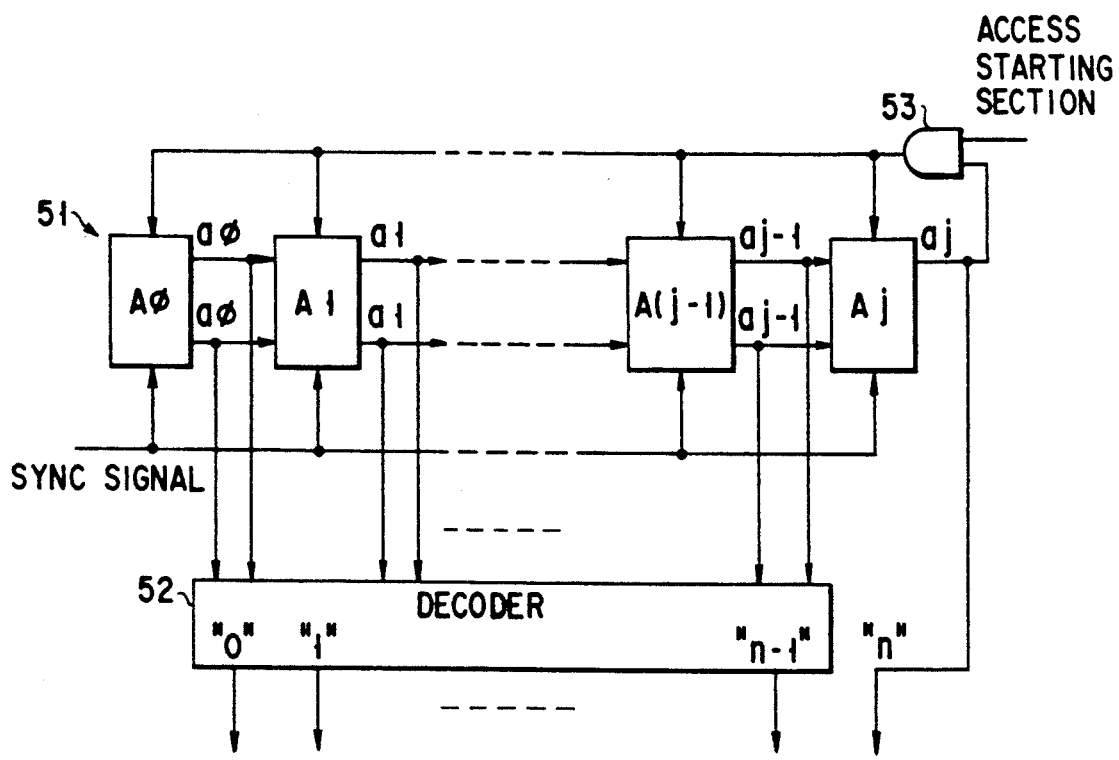
FIG. 9 is a circuit diagram of another example of the address circuit of FIG. 3.
FIG. 10 is a timing diagram for explaining the operation of the sequential decoder of FIG. 9.

FIG. 9 is a circuit diagram of a sequential decoder usable in place of the shift register SR of FIG. 5.

FIG. 10 is a timing diagram for explaining the operation of the sequential decoder of FIG. 9.

The sequential decoder of FIG. 9 contains a j+1 stage address counter 51 for counting in response to a synchronous signal (a count-up signal), a decoder circuit 52 for decoding the outputs a0 to a(j-1) of the A0 to A(j-1) stages of this address counter 51 to produce n outputs 0 to n-1 in sequence, and then supplying them as operation control signals to n groups of word-line driving circuits (not shown), and an AND circuit 53 for ANDing the final-stage output aj of the address counter 51 with the serial access starting signal, and supplying the output as a reset signal to the address counter 51.

In the sequential decoder, when the final-stage output aj of the address counter 51 occurs (is activated) after the completion of a serial access, the final-stage output aj causes the start address of the next serial access to be shifted by one cell. After this shift operation, when a serial access starting signal arrives, the address counter 51 is reset to count up again for the next serial access.

Figure 11:
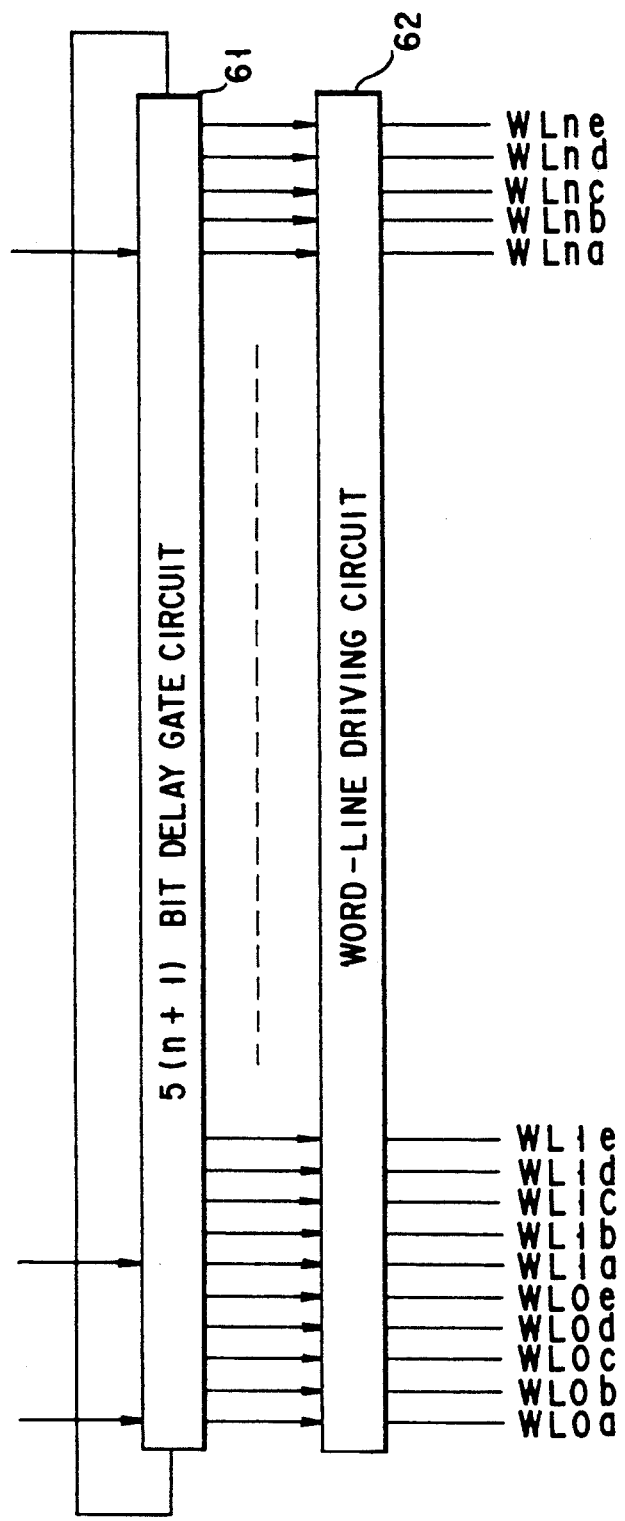
FIG. 11 is a block diagram for another example of the address circuit and word-line driving circuit of FIG. 3.
Figure 12:
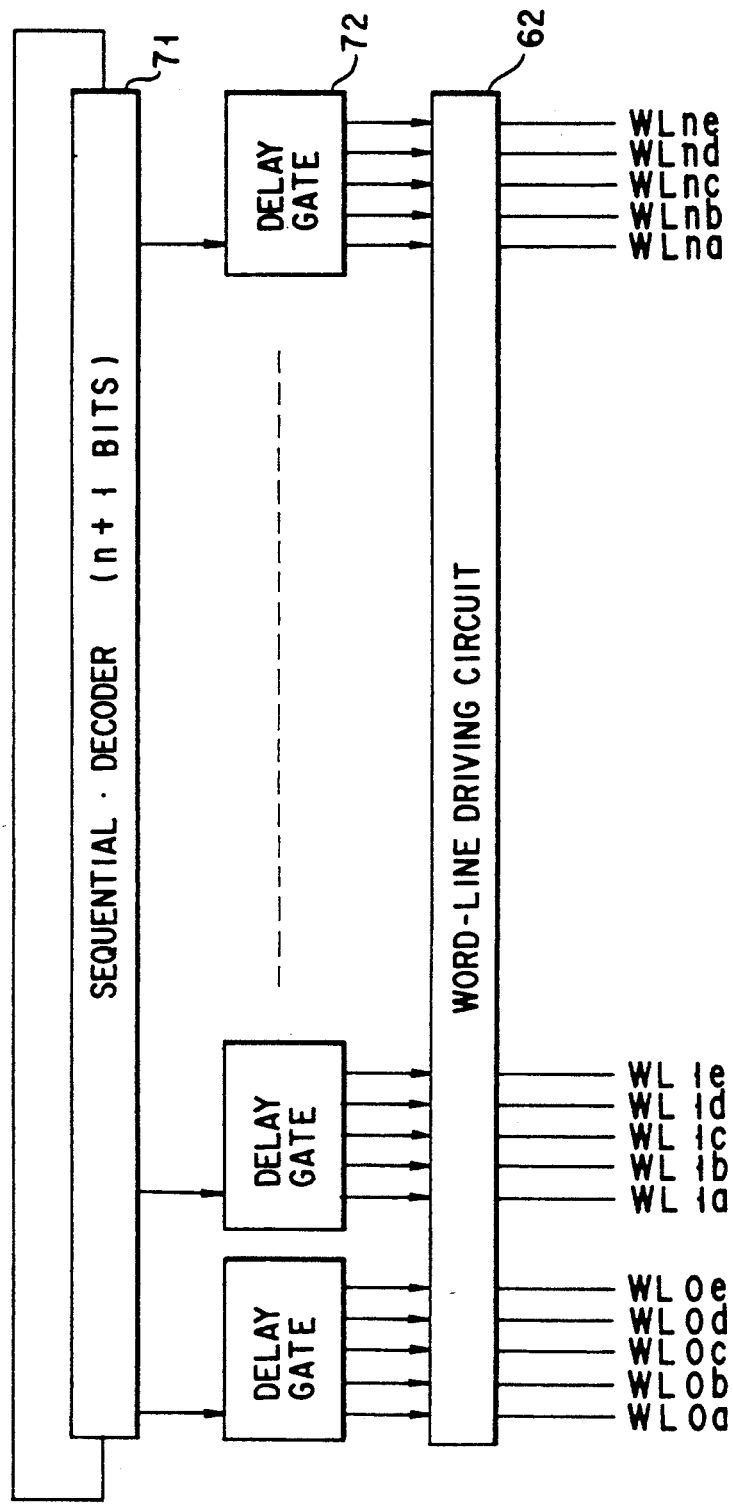
FIG. 12 is a block diagram for still another example of the address circuit and word-line driving circuit of FIG. 3.

Instead of the shift register SR and word-line driving circuit 33 in FIG. 5, circuits shown in FIGS. 11 and 12 may be used.

In the circuit of FIG. 11, a 5(n+1) bit delay gate circuit 61 is connected in a ring with each inter-stage output being supplied to the word-line driving circuit 62 for 5(n+1) bits. At the start of a serial access, a pulse signal of a specified width (a word-line select signal) is supplied to the input terminal of a delay gate circuit stage corresponding to a specified address (the address one cell ahead of the start address), and at the end of the serial access, the input terminal of the delay gate circuit stage is reset.

In the FIG. 12 circuit, the n+1 decode outputs of a bit sequential decoder 71 for n+1 bits connected in a ring are supplied to n+1 5-bit delay gate circuits 72 with each inter-stage output being supplied to the word-line driving circuit 62 for 5(n+1) bits. At the start of a serial access, the circuit stages are caused to produce the decode outputs, starting with a circuit stage corresponding to a specified address (the address one cell ahead of the start address) of the sequential decoder 71, and the decode outputs are scanned so as to cover all addresses. At this time, the word-line select signals are supplied in a scanning manner to the word-line driving circuit 62 from each inter-stage of the delay gate circuit 72 to which the decode outputs are supplied. Then, the word-line driving circuit 62 drives the word lines (WL0a to WL0e) to (WLna to WLne) in sequence.

For the circuits of FIGS. 11 and 12, the operation of setting back the start address by one cell for the word line to be accessed next time, may be achieved by the following construction, for example.

In one construction, an n-bit rotator circuit is provided, and one bit is set in the "1" state at the initial setting. This bit is rotated bit by bit each time a serial access takes place, and the start address may be specified based on the output of the bit rotator circuit.

In another construction, an address pointer register or counter is provided. The contents (the start address) of the address pointer is updated each time a serial access takes place, and the start address may be specified based on the output of the address pointer.

Further, in place of the shift register SR of FIG. 5, (n+1) row decoders (word-line select circuit) and (n+1) delay gate circuits may be used. In this case, the outputs of the n+1 row decoders are supplied to n+1 5-bit delay gate circuits, each inter-stage output of which is supplied to the bit word-line driving circuit (indicated by numeral 62 in FIGS. 11 and 12) for 5(n+1) bits. In a serial access, the row address signals are supplied to the row decoders so as to cover all addresses. At this time, the word-line select signals are supplied in a scanning manner to the word-line driving circuit from each inter-stage of the delay gate circuit to which the row decoder corresponding to a specified address is connected. Then, the word-line driving circuit drives the word lines (WL0a to WL0e) to (WLna to WLne) in sequence.

For such a serial access, when row address signals are supplied to the row decoders, the row address signal can be controlled outside the chip so as to set back the start address by one cell for the word line at which access is to be started each time a serial access occurs.

Figure 13:
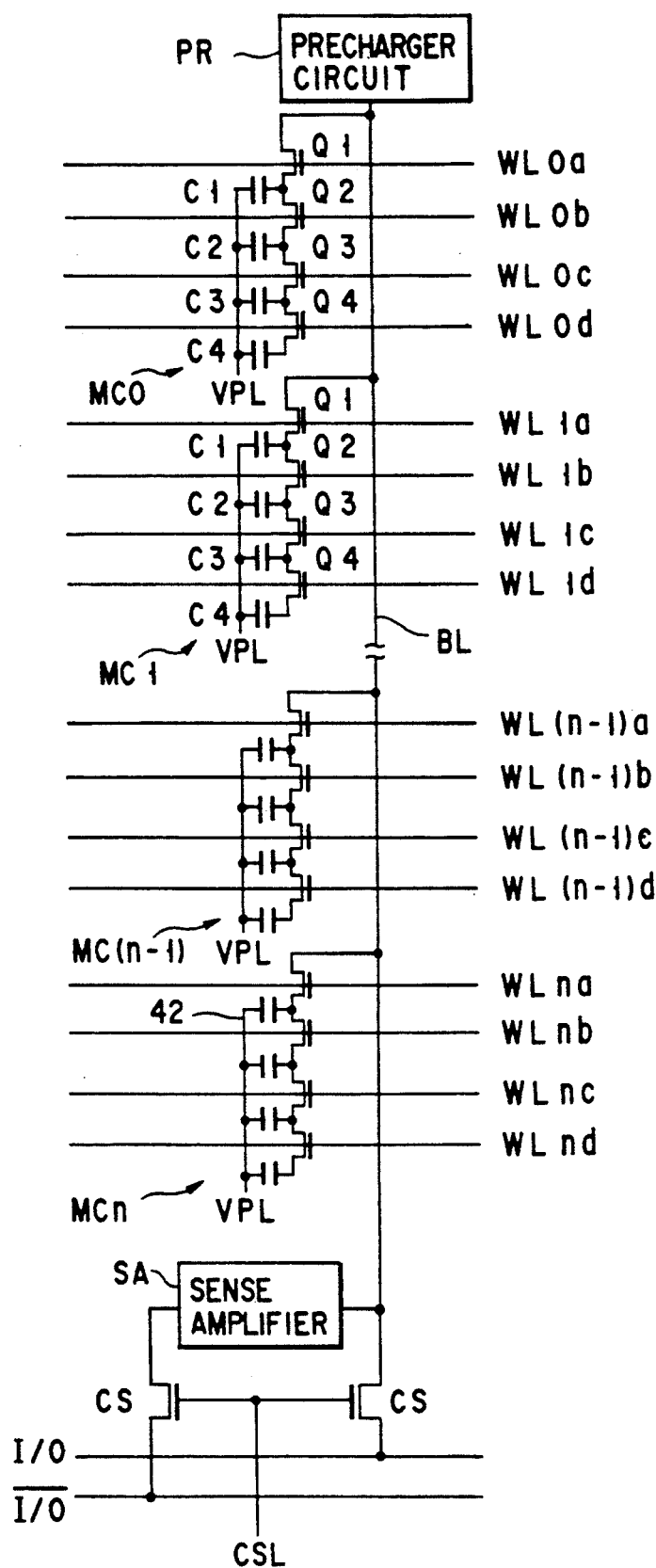
FIG. 13 is a circuit diagram for a portion of a DRAM according to a second embodiment of the present invention.

FIG. 13 is a circuit diagram of a portion (one column of memory cells) of a DRAM according to a second embodiment of the present invention.

This DRAM differs from the DRAM of FIG. 3 in respect to memory cells MC0 to MCn and associated circuitry.

The memory cells MC0 to MCn each contain a cascade gate, where a plurality of MOS transistors Q1 to Q4 (four transistors in this case) are cascade-connected to each other with one end (the Q1 side) connected to the read/write node N1, and a plurality of information-storing capacitors C1 to C4 with one end of each capacitor connected to a corresponding MOS transistor at one end further away from the node N1. The node N1 is connected to the bit line BL. The gates of the MOS transistors Q1 to Q4 of the DRAM cells MC0 to MCn are connected to word lines (WL0a to WL0e), . . . , (WLna to WLne), respectively. The other end of each of capacitors C1 to C4 is connected in common to a capacitor wire 42. In this embodiment, the plate electrodes of the capacitors C1 to C4 are connected to each other and this plate electrode is supplied with a specified capacitor plate potential $V_{PL}$ which is also supplied to the other DRAM cells.

Figure 14:
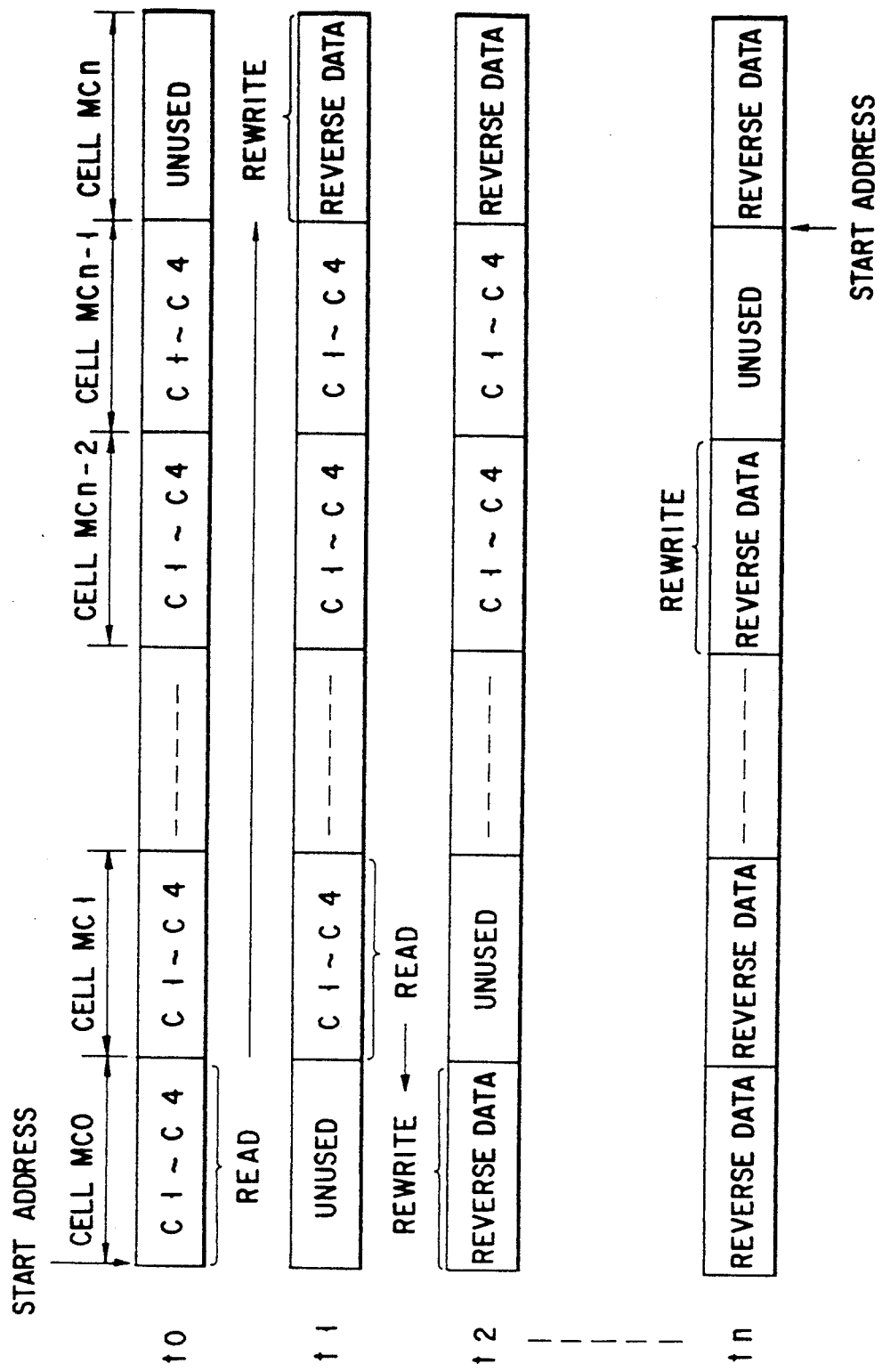
FIG. 14 is a timing diagram for explaining the operation of serially accessing the memory cells in any given column within the DRAM of FIG. 13.

FIG. 14 is a timing diagram for explaining the operation of serially accessing the memory cells in any given column of FIG. 13.

In the FIG. 13 DRAM, it is assumed that in the initial state, the cells MC0 to MC(n-1) in a column store block data with cell MCn not in use. The serial access of sequentially reading out the block data and at the same time will be outlined, rewriting it, referring to FIG. 14.

In a first serial access, at time t0, the operation is started to sequentially read the stored information from the capacitors C1 to C4 of cell MC0 and then sequentially rewrite the 4-bit information into the capacitors C4 to C1 of an unused different cell (MCn at this time) in the same column. At time t1, the 4-bit information is sequentially read from the cell MC1 and then rewritten into an unused different cell (MC0 at this time) in the same column. Similarly, the operation of sequentially reading the 4-bit information from cell MCi and rewriting it into cell MC(i-1) is repeated. Finally, at time tn, the 4-bit information in the cell MC(n-1) is rewritten into the cell MC(n-2).

By such a serial access, the block data has been stored in cells MCn, MC0 to MC(n-2). It should be noticed that after this serial access, the sequence of the 4-bit data stored in cells MCn, MC0 to MC(n-2) is the reverse of that in cells MC0 to MC(n-1) before this serial access. Thus, it is necessary to take into account the fact that the order of data in the block data to be read is reversed in units of 4 bits, when reading the stored information.

In the next serial access, the operation begins by reading data from cell MCn, one cell ahead of the start address (word-line address) for the preceding serial access, and then rewriting it into cell MC(n-1), and ends by rewriting the data read from cell MC(n-2) into cell MC(n-3). Through this serial access, the block data is stored in cells MC(n-1), MCn, MC0 to MC(n-3). The order of the 4-bit data stored in cells MC(n-1), MCn, MC0 to MC(n-3) after this serial access, is opposite to that in cells MC0 to MC(n-1) before this access, meaning that the order has returned to the original sequence.

That is, depending on whether the serial access is repeated an even number of times or an odd number of times, the result will be that the order of data in the block data read out is the same as the original order or is reverse in units of 4 bits. To cope with this problem, as shown by broken lines in FIG. 3, it is necessary to provide an even-odd judging circuit 40 containing, for example, a flag means (for example, a flip-flop circuit) for indicating that serial access is an even time one or an odd time one, and a correction means for correcting the order of read-out data based on the output of the odd-even judging circuit 40 when the reading of block data has been done an even number of times (that is, the data is reversed in units of 4 bits). For such a correction means, a serial-parallel converting circuit 39 for serial-parallel converting read-out 4-bit data or a serial-parallel converting means for serial-parallel converting read-out 4-bit data in units of 2 cells (8 bits) or of 4 cells (16 bits) may be used.

The operation between time t0 and time t1 will be described in detail, referring to FIG. 15.

FIG. 15 is a timing waveform diagram for explaining the operation of the DRAM of FIG. 13.

The word lines (WL0a to WL0d) are controlled so as to turn on the transistors Q1 to Q4 of cell MC0 in that order. With a specified timing with respect to control of these word lines, the word lines (WLna to WLnd) are controlled so as to turn off the transistors Q4 to Q1 of cell MCn in that order. When all the transistors Q1 to Q4 of cell MCn are on and the transistors Q1 to Q4 of all the other cells MC0 to MC(n-1) are off (at time t0), the bit-line precharging circuit PR precharges the bit line BL to a specified potential for a certain period of time. In this state, turning on the transistor Q1 of cell MC0 allows the stored information in the capacitor C1 of cell MC0 to be read out on the bit line BL via the transistor Q1. With the timing of ts, the sense amplifier SA operates to supply the read-out information. After the rewrite potential has been set on the bit line BL by this sense output, when the transistor Q4 of cell MCn is turned off, the potential of the bit line BL (the stored information in the capacitor C1 of cell MC0) is stored in the capacitor C4 of cell MCn. Then, after the bit line BL has been precharged again, when the transistor Q2 of cell MC0 is turned on, the stored information in the capacitor C2 of cell MC0 is read out on the bit line BL via the transistors Q2 and Q1. With the timing of ts, this read-out information is sensed by the sense amplifier SA, which in turn supplies it. After the rewrite potential has been set on the bit line BL by this sense output, when the transistor Q3 of cell MCn is turned off, the potential of the bit line BL (the stored information in the capacitor C2 of cell MC0) is stored in the capacitor C3 of cell MCn. Then, after the bit line BL has been precharged again, when the transistor Q3 of cell MC0 is turned on, the stored information in the capacitor C3 of cell MC0 is read out on the bit line BL via the transistors Q3 to Q1. With the timing of ts, this read-out information is sensed by the sense amplifier SA, which in turn supplies it. After the rewrite potential has been set on the bit line BL by this sense output, when the transistor Q2 of cell MCn is turned off, the potential of the bit line BL (the stored information in the capacitor C3 of cell MC0) is stored in the capacitor C2 of cell MCn. Then, after the bit line BL has been precharged again, when the transistor Q4 of cell MC0 is turned on, the stored information in the capacitor C4 of cell MC0 is read out on the bit line BL via the transistors Q4 to Q1. With the timing of ts, this read-out information is sensed by the sense amplifier SA, which in turn supplies it. After the rewrite potential has been set on the bit line BL by this sense output, when the transistor Q1 of cell MCn is turned off, the potential of the bit line BL (the stored information in the capacitor C4 of cell MC0) is stored in the capacitor C1 of cell MCn. As a result of this, all the transistors Q1 to Q4 of cell MC0 are on, and the transistors Q1 to Q4 of all the other cells MC1 to MCn are off, waiting for the reading of data from the next cell MC1 and the rewriting of the data into cell MC0.

In this state, by performing on/off control of the word lines (WL1a to WL1d) and (WL0a to WL0d) so that the transistors Q1 to Q4 of cell MC1 may be turned on in that order and, with a specified timing with respect to control of these transistors, the transistors Q4 to Q1 of cell MC0 be turned off in that order, it is possible to read the stored information from cell MC1 and rewrite it into cell MC0 in the same manner as reading from cell MC0 and rewriting into cell MCn.

As with the FIG. 3 DRAM, the DRAM of FIG. 13 also enables 4 bits×128=512 bits (or 64 bytes) to be read from one column in sequence, which eliminates a storing means for temporarily storing the information read in time-sequence from cells for rewriting, thereby making the packing density higher and the chip size much smaller.

In the FIG. 13 DRAM, when the arrangement of transistors Q1 to Q4 in odd-numbered cells in a column is made opposite to that of transistors Q1 to Q4 in even-numbered cells, the transistor Q1 of each even-numbered cell comes next to that of each odd-numbered cell. Therefore, it is possible for the odd-numbered cell and the adjacent even-numbered cell to share a bit-line contact, as with the FIG. 3 DRAM. This construction provides one bit-line contact for every 8 bits (or ½ bit-line contact for every 4 bits), thus reducing the capacity of the bit line.

Since in most actual DRAMs, the pitch of the arrangement of sense amplifiers SA is larger than that of the arrangement of bit lines BL, it is desirable to provide a switching circuit such as a transfer gate TG between the bit line BL and sense amplifier SA, and to use shared sense amplifier techniques where one sense amplifier SA is changed over by a switching means so that a plurality of columns (normally, 2, 4, 8, . . . ) may share it in a time sharing manner.

FIG. 16 is a circuit diagram of a portion of a DRAM according of a third embodiment of the present invention.

This DRAM is such that shared sense amplifier techniques are applied to, for example, the DRAM of FIG. 3. Specifically, a plurality of bit lines (4 bit lines, for example) BLa to BLd and transfer gates TGa to TGd share one sense amplifier SA. Control signals φa to φd cause the transfer gates TGa to TGd to selectively connect only one of the bit lines BLa to BLb to the sense amplifier.

In the DRAM of FIG. 16, when the stored 4-bit information is sequentially read from the capacitors C1 to C4 in a cell and is rewritten in sequence into the capacitors C1 to C4 in an unused different cell in the same column, the 4-bit information in four columns of cells in the same row is read simultaneously bit by bit onto the bit lines BL. These bits are amplified in time sharing manner by the sense amplifier SA, and are rewritten into an unused cell in the same column.

Performing the read/rewrite operation on cells along with sequential selection of 4 columns enables the reading/rewriting of 16 bits (=4 bits×4 columns) in a determined sequence.

With the FIG. 16 DRAM, use of shared sense amplifier techniques prevents the pattern area of the sense amplifiers SA on the memory chip from increasing, achieving much higher packing density and greater memory capacity.

The technique of using a shared sense amplifier system in an array of DRAM cells where a plurality of bits are read out in time-sequence has been disclosed in K. Kimura, et al., "A Block-Oriented RAM with Half-Sized DRAM Cell and Quasi-Folded Data-Line Architecture," 1991 IEEE ISSCC DIGEST OF TECHNICAL PAPERS, pp. 107. In this literature, however, the serial access techniques as explained in the present invention have not been disclosed.

In the DRAMs in the previous embodiments, by sequentially selecting a plurality of columns and accessing cell so that the start address is decreased by one cell each time, for example, one column selection is completed, the read-out bits from the plurality of columns can be read in sequence.

The cell array construction of the DRAM of the present invention may be applied to a folded bit line construction and an open bit construction.

The bit-line sense amplifiers SA in the DRAM of this invention may be applied to a construction where one input node is connected to bit line only (what is called a single-end sense amplifier construction) and to a construction where a pair of input nodes is connected to a complementary pair of bit lines.

When a folded bit line construction or an open bit line construction is used and a transfer gate is provided between the bit line and the sense amplifier, the DRAM of this invention may be constructed so that a plurality of bit-line pairs and transfer gates may share one sense amplifier, and the transfer gates be controlled so as to selectively connect only one bit-line pair to the sense amplifier.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device, comprising:
a memory cell array in which cascade dynamic memory cell units each capable of storing a plurality of bits of information in bits are arranged in a matrix, the memory cells in the same row being connected in common to a corresponding one of a plurality of word lines and the memory cell units in the same column being connected in common to a corresponding one of a plurality of bit lines; and
serial access control means which serially accesses a plurality of memory cell units in a given column of said memory cell array, reads a plurality of bits of information in time-sequence from one of the memory cell units storing information through one of said bit lines connected to the one of said memory cell units, and then sequentially rewrites the bits of information into a different memory cell unit of the memory cell array unused for storing valid data, in the same column containing said one memory cell unit.

2. A semiconductor memory device according to claim 1, wherein each of said memory cell units contain a cascade gate wherein both ends of three or more MOS transistors cascade-connected to each other are connected to the same one of said bit lines, and a plurality of information-storing capacitors each having a first end connected to a corresponding connection node between said MOS transistors, a gate of each MOS transistor being connected to a different one of said word lines.

3. A semiconductor memory device according to claim 1, wherein each of said memory cell units contains a cascade gate wherein one end of a plurality of MOS transistors cascade-connected to each other is connected to one of said bit lines, and a plurality of information-storing capacitors each having a first end connected to the other end, farther from the said one of said bit lines, of one of said MOS transistors, a gate of each MOS transistor being connected to a different one of said word lines.

4. A semiconductor memory device according to claims 1 through 3, wherein said plurality of memory cell units in said column contain n memory cell units for storing continuous block data, and a memory cell unit for performing an initial writing of the block data at the start of a serial access.

5. A semiconductor memory device according to claim 4, wherein said serial access control means contains:
a sense amplifier provided for each column inside memory cell array;
a row address circuit for serially addressing a plurality of memory cell units in any given column of said memory cell array; and
a word-line driving circuit for selectively driving the word lines connected to the memory cell unit with the address specified by the row address circuit.

6. A semiconductor memory device according to claim 5, wherein said serial access control means includes means for sequentially performing the reading/rewriting of a plurality of bits of information from and into two different memory cell units in said column and of sequentially reading block data from n memory cell units included in (n+1) memory cell units in said column, and at the same time, rewriting the block data into n memory cell units including an unused memory cell unit before this read operation.

7. A semiconductor memory device according to claim 6, wherein said serial access control means has the function of shifting the start address, by one memory cell unit for the memory cell unit at which the next access is to be started, at the time when each serial access takes place.

8. A semiconductor memory device according to claim 5, further comprising a transfer gate inserted between the bit line and the sense amplifier in said column and turned on and off with a specified timing, which is turned off immediately after the signal read from said memory cell unit has been transmitted to said sense amplifier.

9. A semiconductor memory device according to claim 4, wherein said serial access control means comprises:
- a sense amplifier provided for every plurality of columns in said memory array;
- a switching circuit for selectively connecting the sense amplifier electrically to the plurality of columns;
- a row address circuit for serially addressing a plurality of memory cell units in any given column of said memory cell array;
- a word-line driving circuit for selectively driving the word lines connected to the memory cell unit with the address specified by the row address circuit; and
- means for sequentially selecting the plurality of columns to share said sense amplifier in a time sharing manner in a serial access to each memory cell unit in said plurality of columns.

10. A semiconductor memory device according to claim 9, wherein said serial access control means includes means for sequentially performing the reading/rewriting of a plurality of bits of information from and into two different memory cell units in said column and of sequentially reading block data from n memory cell units included in (n+1) memory cell units in said column, and at the same time, rewriting the block data into n memory cell units including a memory cell unit unused for storing valid data before this read operation.

11. A semiconductor memory device according to claim 10, wherein said serial access control means has the function of shifting the start address, by one memory cell unit, for the memory cell unit at which the next access is to be started, at the time when each serial access takes place.

12. A semiconductor memory device according to claim 2, wherein said serial access control means comprises:
- a shift register or a sequential decoder having as many stages as 1/k (k: an integer) the number of word lines of said memory cell array; and
- n+1 groups of word-line driving circuits, each group consisting of k word-line driving circuits, which are selectively controlled by corresponding outputs from the shift register or sequential decoder and which selectively drive the word lines connected the memory cell unit with the address specified by the outputs.

13. A semiconductor memory device according to claim 3, wherein said serial access control means further contains an even-odd judging circuit for judging whether the serial access is an even time one or an odd time one, and correction means for correcting the order of the plurality of bits based on the judgment output of the even-odd judging circuit in the case of a serial access where the plurality of bits of information read form memory cell units are in the reverse order of the original sequence.

14. A semiconductor memory device according to claim 13, wherein said correction means is means for serial-parallel converting a plurality of bits or information read from memory cell units.

15. A semiconductor memory device, comprising:
- bit lines;
- circuit units each connected to a corresponding one of said bit lines, each circuit unit connected to the corresponding bit line at respective first and second data nodes and comprising:
  - at least three transistors connected in series between said first and second data nodes such that a first terminal of a first transistor in said series is connected to said first data node, a second terminal of a last transistor in said series is connected to said second data node, and a first terminal of each remaining transistor in said series is connected to a second terminal of the immediately preceding transistor in said series; and
  - a plurality of data storage capacitors, each data storage capacitor having a first terminal connected to the second terminal of one of said transistors except said last transistor in said series;
- word lines connected to control terminals of said transistors; and
- access control circuitry connected to said word lines for reading a data item from a first data storage capacitor of a first circuit unit having valid data items at an access time and writing said data item to a first data storage capacitor of a second circuit unit not having valid data items at said access time.

16. The semiconductor memory device according to claim 15, wherein said first and second circuit units are connected to the same bit line.

17. The semiconductor memory device according to claim 15, wherein said circuit units comprise (n+1) sequentially ordered circuit units MC0, MC1, ... MCn, and said first circuit unit is circuit unit MC0 and said second circuit unit is circuit unit MCn.

18. The semiconductor memory device according to claim 17, wherein said access control circuitry controls a first serial access operation in which data items read from the data storage capacitors of circuit unit MC0 are written to the data storage capacitors of circuit unit MCn and data items read from each remaining circuit unit are written to the immediately preceding circuit unit in said sequence of ordered circuit units, whereby the data storage capacitors of circuit unit MCn-1 contain invalid data at the end of the first serial access operation.

19. The semiconductor memory device according to claim 18, wherein said access control circuitry controls a second serial access operation in which data items read from the data storage capacitors of circuit unit MCn are written to the data storage capacitors of circuit unit MCn-1, data items read from the data storage capacitors of circuit unit MC0 are written to the data storage capacitors of circuit unit MCn and data items read from each remaining circuit unit are written to the immediately preceding circuit unit in said sequence of ordered circuit units, whereby the data storage capacitors of circuit unit MCn-2 contain invalid data at the end of the second serial access operation.

20. The semiconductor memory device according to claim 15, wherein said word lines are connected to gates of said transistors and said access control circuitry includes:
- word line address circuitry for supplying first address signals for addressing said word lines; and
- word line driving circuitry for driving said word lines in accordance with said first address signals to control the ON/OFF switching of said transistors.

21. The semiconductor memory device according to claim 20, wherein said word line address circuitry comprises a shift register.

22. The semiconductor memory device according to claim 20, wherein said word line address circuitry comprises:
- an address counter;
- a decoder for decoding outputs of said address counter; and
- means for resetting said address counter.

23. The semiconductor memory device according to claim 20, wherein said word line driving circuitry comprises:
- a first MOS transistor for a first conductivity type having a first terminal connected to a first predetermined potential and a gate connected to said word line address circuitry;
- a second MOS transistor of the first conductivity type having a first terminal connected to a second terminal of said first MOS transistor and a gate applied with first clock signals; and
- a third MOS transistor of a second conductivity type having a first terminal connected to a second terminal of said second MOS transistor, a second terminal connected to a second predetermined potential, and a gate applied with second clock signals, wherein
- an output node of said word line driving circuitry is the connection node of said first terminal of said third MOS transistor and said second terminal of said second MOS transistor.

24. The semiconductor memory device according to claim 23, wherein said access control circuitry further comprises:
- a first clock generator for generating the first clock signals; and
- a second clock generator for generating the second clock signals.

25. The semiconductor memory device according to claim 15, further comprising:
- an I/O circuit for inputting data to and outputting data from said bit lines.

26. The semiconductor memory device according to claim 15, further comprising:
- sense amplifiers for sensing and amplifying potentials of said bit lines.

27. The semiconductor memory device according to claim 26, wherein said sense amplifiers comprise latch amplifiers.

28. The semiconductor memory device according to claim 26, wherein said sense amplifiers comprise differential amplifiers.

29. The semiconductor memory device according to claim 15, further comprising:
- a precharge circuit for precharging said bit lines.

30. The semiconductor memory device according to claim 15, further comprising:
- an input/output gate for inputting data to and outputting data from said bit line;
- input/output lines connected to said input/output gate;
- a buffer circuit connected to said input/output lines;
- a serial to parallel converging circuit for serial to parallel conversion of data output from said bit line.

31. The semiconductor memory device according to claim 15, wherein said access control circuitry serially reads the respective data items from the remaining data storage capacitors of said first circuit unit and writes said respective data items to the remaining data storage capacitors of said second circuit unit.

32. The semiconductor memory device according to claim 15, further comprising:
- sense amplifiers; and
- switches for selectively connecting at least two bit lines to each sense amplifier.

33. The semiconductor memory device according to claim 15, wherein second terminals of said data storage capacitors are connected together.

34. A semiconductor memory device, comprising:
- a bit line;
- circuit units connected to said bit line, each circuit unit connected to said bit line at respective first nodes and comprising:
  - at least two transistors connected in series such that a first terminal of a first transistor in said series is connected to said first data node and a first terminal of each remaining transistor in said series is connected to a second terminal of the immediately preceding transistor in said series; and
  - data storage capacitors each having a first terminal connected to the second terminal of one of said transistors;
- word lines connected to control terminals of said transistors; and
- access control circuitry coupled to said word lines for reading a first data item from a first data storage capacitor of a first circuit unit having valid data items at an access time and writing said first data item to a first data storage capacitor of a second circuit unit not having valid data items at said access time.

35. The semiconductor memory device according to claim 34, wherein said first and second circuit units are connected to the same bit line.

36. The semiconductor memory device according to claim 34, wherein said circuit units comprise sequentially ordered circuit units MC0, MC1, . . . MCn, and said first circuit unit is circuit unit MC0 and said second circuit unit is circuit unit MCn.

37. The semiconductor memory device according to claim 36, wherein said access control circuitry controls a first serial access operation in which data items read from the data storage capacitors of circuit unit MC0 are written to the data storage capacitors of circuit unit MCn and data items read from each remaining circuit unit are written to the immediately preceding circuit unit in said sequence of ordered circuit units, whereby the data storage capacitors of circuit unit MCn-1 contain invalid data at the end of the first serial access operation.

38. The semiconductor memory device according to claim 37, wherein said access control circuitry controls a second serial access operation in which data items read from the data storage capacitors of circuit unit MCn are written to the data storage capacitors of circuit unit MCn-1, data items read from the data storage capacitors of circuit unit MC0 are written to the data storage capacitors of circuit unit MCn and data items read from each remaining circuit unit are written to the immediately preeceding circuit unit in sad sequence of ordered circuit units, whereby the data storage capacitors of circuit unit MCn-2 contain invalid data at the end of the second serial access operation.

39. The semiconductor memory device according to claim 34, wherein said word lines are connected to gates of said transistors and said access control circuitry includes:
   word line address circuitry for supplying first address signals for addressing said word lines; and
   word line driving circuitry for driving said word lines in accordance with said first address signals to control the ON/OFF switching of said transistors.

40. The semiconductor memory device according to claim 39, wherein said word line address circuitry comprises a shift register.

41. The semiconductor memory device according to claim 39, wherein said word line address circuitry comprises:
   an address counter;
   a decoder for decoding outputs of said address counter; and
   means for resetting said address counter.

42. The semiconductor memory device according to claim 39, wherein said word line driving circuitry comprises:
   a first MOS transistor of a first conductivity type having a first terminal connected to a first predetermined potential and a gate connected to said word line address circuitry;
   a second MOS transistor of the first conductivity type having a first terminal connected to a second terminal of said first MOS transistor and a gate applied with first clock signals; and
   a third MOS transistor of a second conductivity type having a first terminal connected to a second terminal of said second MOS transistor, a second terminal connected to a second redetermined potential, and a gate applied with second clock signals, wherein
   an output node of said word line driving circuitry is the connection node of said first terminal of said third MOS transistor and said second terminal of said second MOS transistor.

43. The semiconductor memory device according to claim 42, wherein said access control circuitry further comprises:
   a first clock generator for generating the first clock signals; and
   a second clock generator for generating the second clock signals.

44. The semiconductor memory device according to claim 34, further comprising:
   an I/O) circuit for inputting data to and outputting data from said bit lines.

45. The semiconductor memory device according to claim 34, further comprising:
   sense amplifiers for sensing and amplifying potentials of said bit lines.

46. The semiconductor memory device according to claim 45, wherein said sense amplifiers comprise latch amplifiers.

47. The semiconductor memory device according to claim 45, wherein said sense amplifiers comprise differential amplifiers.

48. The semiconductor memory device according to claim 34, further comprising:
   a precharge circuit for precharging said bit lines.

49. The semiconductor memory device according to claim 34, wherein said access control circuitry serially reads the respective data items from the remaining data storage capacitors of said first circuit unit and writes said respective data items to the remaining data storage capacitors of said second circuit unit.

50. The semiconductor memory device according to claim 34, further comprising:
   an input/output gate for inputting data to and outputting data from said bit line;
   input/output lines connected to said input/output gate;
   a buffer circuit connected to said input/output lines;
   a serial to parallel converting circuit for serial to parallel conversion of data output from said bit line.

51. The semiconductor memory device acceding to claim 50, further comprising:
   an odd/even determination circuit for determining whether said access control circuit has controlled an odd or an even number of access operations, and wherein
   the serial to parallel conversion of data output from said bit line by said serial to parallel conversion circuit is controlled in accordance with the determination of said odd/even determination circuit.

52. The semiconductor memory device according to claim 34, further comprising:
   sense amplifiers; and
   switches for selectively connecting at least two bit lines to each sense amplifier.

53. The semiconductor memory device according to claim 34, wherein second terminals of said data storage capacitors are connected together.

* * * * *